United States Patent
Lin et al.

(10) Patent No.: US 8,085,086 B1
(45) Date of Patent: Dec. 27, 2011

(54) NON-VOLATILE MEMORY DEVICE AND CHARGE PUMP CIRCUIT FOR THE SAME

(75) Inventors: Yung Feng Lin, Taoyuan County (TW); Nai-Ping Kuo, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/839,663

(22) Filed: Jul. 20, 2010

(51) Int. Cl.
*G05F 1/10* (2006.01)

(52) U.S. Cl. ............................................... 327/536

(58) Field of Classification Search .............. 327/535, 327/536, 537
See application file for complete search history.

(56) References Cited

U.S. PATENT DOCUMENTS

| | | | |
|---|---|---|---|
| 5,734,290 A | 3/1998 | Chang et al. | |
| 5,954,828 A | 9/1999 | Lin | |
| 6,456,154 B2 * | 9/2002 | Sugimura | 327/537 |
| 6,768,366 B2 | 7/2004 | Kuo et al. | |
| 6,795,350 B2 | 9/2004 | Chen et al. | |
| 7,190,211 B2 * | 3/2007 | Nakagawa et al. | 327/536 |
| 7,236,061 B2 | 6/2007 | Lin | |
| 7,595,682 B2 * | 9/2009 | Lin et al. | 327/536 |
| 7,599,225 B2 | 10/2009 | Loh et al. | |
| 2006/0186947 A1 | 8/2006 | Lin et al. | |

* cited by examiner

*Primary Examiner* — Jeffrey Zweizig
(74) *Attorney, Agent, or Firm* — Baker & McKenzie LLP

(57) ABSTRACT

A charge pump apparatus comprises a plurality of charge pump stages, including a first stage, and one or more succeeding stages. The charge pump stages each include a respective output node. Each output node is connected to charge boosting circuitry and to precharge circuitry. The charge boosting circuit receives one or more clock signals. The precharge circuits have a first state allowing the respective pump-stage output node to fluctuate at a level above a standby wordline voltage, and a second state coupling the respective pump-stage output node to the standby wordline voltage.

21 Claims, 6 Drawing Sheets

NON-VOLATILE MEMORY DEVICE AND CHARGE PUMP CIRCUIT FOR THE SAME

BACKGROUND

1. Technical Field

The present application relates to integrated circuits, and more specifically to charge pump circuitry used in integrated circuits.

2. Related Art

Integrated circuits, sometimes referred to as microchips or semiconductor devices, are in widespread use and can be found in almost all electronic equipment in use today. A typical integrated circuit will include a pin for receiving an external supply voltage VDD that is predetermined and configured to remain at an at least somewhat constant voltage level during operation. However, some integrated circuits are configured to use one or more voltage levels that exceed the supply voltage VDD for at least some operations. For example, some integrated circuits are memory devices that use a voltage greater than supply voltage VDD for read and/or write operations.

Such integrated circuits will often include one or more charge pumping circuits. A charge pumping circuit is a circuit that can provide a voltage that exceeds the supply voltage VDD. For example, in some flash memory devices, a drain pump circuit is used for providing high voltages for hot-electron programming. A drain pump circuit is a type of charge pumping circuit and typically includes several large pumping capacitors. Also, in some flash memory devices, a standby wordline (WL) voltage is maintained above VDD in order to provide for faster read operations. A sustained capacitance helps to maintain this standby WL voltage. The sustained capacitance can be provided by elements of the memory array, but sometimes the memory array does not provide sufficient sustained capacitance. In such cases, additional capacitance can be added to the peripheral area of the memory chip. However, one of the important goals for integrated circuit designers is to reduce the die size in order to reduce fabrication costs. Thus, the addition of capacitors to the peripheral area of a memory chip runs counter to the desire to reduce the die size and fabrication costs.

Thus, it is desirable to find alternative approaches for providing acceptable levels of sustained capacitance while reducing the die size and fabrication costs of integrated circuits, particularly those comprising electronic memory devices.

SUMMARY

Charge pumping circuits and methods associated with charge pumping circuits, sometimes referred to as charge pumps, are described herein. According to one aspect of the present disclosure, a method for operating a charge pump comprises operating the charge pump in first and second modes. In the first mode, an output voltage at an output terminal of the charge pump is generated by charging pump circuitry to produce a first output voltage signal. In the second mode, an output voltage at the output terminal of the charge pump is generated by a source of a standby wordline voltage to produce a second output voltage signal.

For such a method, the charge pump can have a plurality of stages, and the method can further comprise receiving clock signals to the charge pump and applying the clock signals to stages of the charge pump to produce the first output voltage signal in the first mode of operation. The method can also comprise receiving the standby wordline voltage to the charge pump and applying the standby wordline voltage to stages of the charge pump to produce the second output voltage signal in the second mode of operation.

According to another aspect of the disclosure, an integrated circuit device can comprise a memory array having a first mode for at least one of programming and erasing and a second mode for reading. The integrated circuit device can also comprise charge pump circuitry coupled to the memory array, where the charge pump circuitry is operable in the first mode and the second mode. Such charge pump circuitry can include a plurality of charge pump stages. The integrated circuit device can further comprise precharge circuitry for controlling the charge pump circuitry to operate in the first mode or the second mode. The plurality of charge pump stages can be responsive to a plurality of clock signals while the charge pump is operating in the first mode. The precharge circuitry can couple the charge pump stages to a standby wordline voltage while the charge pump is operating in the second mode.

In some embodiments, the precharge circuitry can comprise a plurality of precharge circuits coupled to respective charge pump stages. At least one precharge circuit in the plurality of precharge circuits can have a first state allowing a node on the corresponding charge pump stage to fluctuate at a level above the standby wordline voltage, and can have a second state coupling the node to the standby wordline voltage. In some such embodiments, one or more of the precharge circuits can comprise first and second PMOS transistors and an NMOS transistor. The first PMOS transistor can have a source terminal coupled to a source of the standby wordline voltage, a drain terminal coupled to said node on the corresponding charge pump stage, and a gate. The second PMOS transistor can have a source terminal coupled to said node on the corresponding charge pump stage, a drain terminal coupled to the gate of the first PMOS transistor, and a gate coupled to an input node. The NMOS transistor can have a source terminal coupled to a reference supply, a drain terminal coupled to the gate of the first PMOS transistor, and a gate coupled to the input node. In some such embodiments, the input node can receive a control signal representative of whether the memory array is operating in the first mode or the second mode.

In some embodiments of the integrated circuit, the plurality of charge pump stages can include a first charge pump stage coupled to an input terminal of the charge pump circuitry, and the precharge circuitry can further comprise a precharge circuit coupled to the input terminal. The precharge circuitry can have a first state allowing the input terminal of the charge pump circuitry to fluctuate at a level above a supply voltage level, and a second state coupling the input terminal of the charge pump circuitry to the supply voltage. In some such embodiments, when the memory array is in the first mode, the precharge circuit can be in the first state, and when the memory array is in the second mode, the precharge circuit can be in the second state.

In some embodiments of the integrated circuit, at least one of the charge pump stages can be configured to receive a single clock signal. In some embodiments of the integrated circuit, at least one of the charge pump stages can be configured to receive first and second clock signals, where the first clock signal is out of phase with the second clock signal.

According to another aspect of the disclosure, a charge pump apparatus can comprise a plurality of stages, including a first stage and one or more succeeding stages. At least one of the succeeding stages can include an output node coupled to another of the plurality of stages. The charge pump apparatus can also comprise a charge boosting circuit and a precharge circuit. The charge boosting circuit can be coupled to the output node of one of the succeeding stages. The charge boosting circuit can be configured for receiving one or more clock signals. The precharge circuit can be coupled to the output node of one of the succeeding stages. The precharge circuit can have a first state allowing the output node to fluctuate at a level above a standby wordline voltage, and a second state coupling the output node to the standby wordline voltage.

In some embodiments of the charge pump apparatus, at least one charge pump stage can be responsive to one or more clock signals while the charge pump apparatus is operating in a first mode. The precharge circuit can couple at least one charge pump stage to the standby wordline voltage while the charge pump is operating in a second mode. The precharge circuit can receives a control signal for controlling the precharge circuit to operate in either the first state or the second state. The charge pump can be configured to operate in the first mode when at least one precharge circuit is in the first state, and charge pump can be configured to operate in the second mode when at least one precharge circuit is in the second state.

In some embodiments of the charge pump apparatus, the pump circuit can include an input terminal coupled between the first stage and a supply voltage.

In some embodiments of the charge pump apparatus, the precharge circuit can be a first precharge circuit, and the pump circuit can further comprise an input terminal coupled between the first stage and a second precharge circuit. The second precharge circuit can have a first state allowing the input terminal to fluctuate at a level above a supply voltage level, and a second state coupling the input terminal to the supply voltage.

In some embodiments of the charge pump apparatus, the precharge circuit can comprise a first PMOS transistor, a second PMOS transistor, and an NMOS transistor. T first PMOS transistor can have a source terminal coupled to a source of the standby wordline voltage, a drain terminal coupled to the output node on the at least one stage, and a gate. The second PMOS transistor can have a source terminal coupled to the output node on the at least one stage, a drain terminal coupled to the gate of the first PMOS transistor, and a gate coupled to an input node. The NMOS transistor can have a source terminal coupled to a reference supply, a drain terminal coupled to the gate of the first PMOS transistor, and a gate coupled to the input node.

In some embodiments of the charge pump apparatus, at least one stage can be configured to receive a single clock signal of the one or more clock signals.

In some embodiments of the charge pump apparatus, at least one stage can be configured to receive first and second clock signals of the one or more clock signals. In some such embodiments, the first clock signal can be out of phase with the second clock signal.

BRIEF DESCRIPTION OF THE DRAWINGS

Features, aspects, and embodiments of the inventions are described in conjunction with the attached drawings, in which.

DETAILED DESCRIPTION

Figure 1:
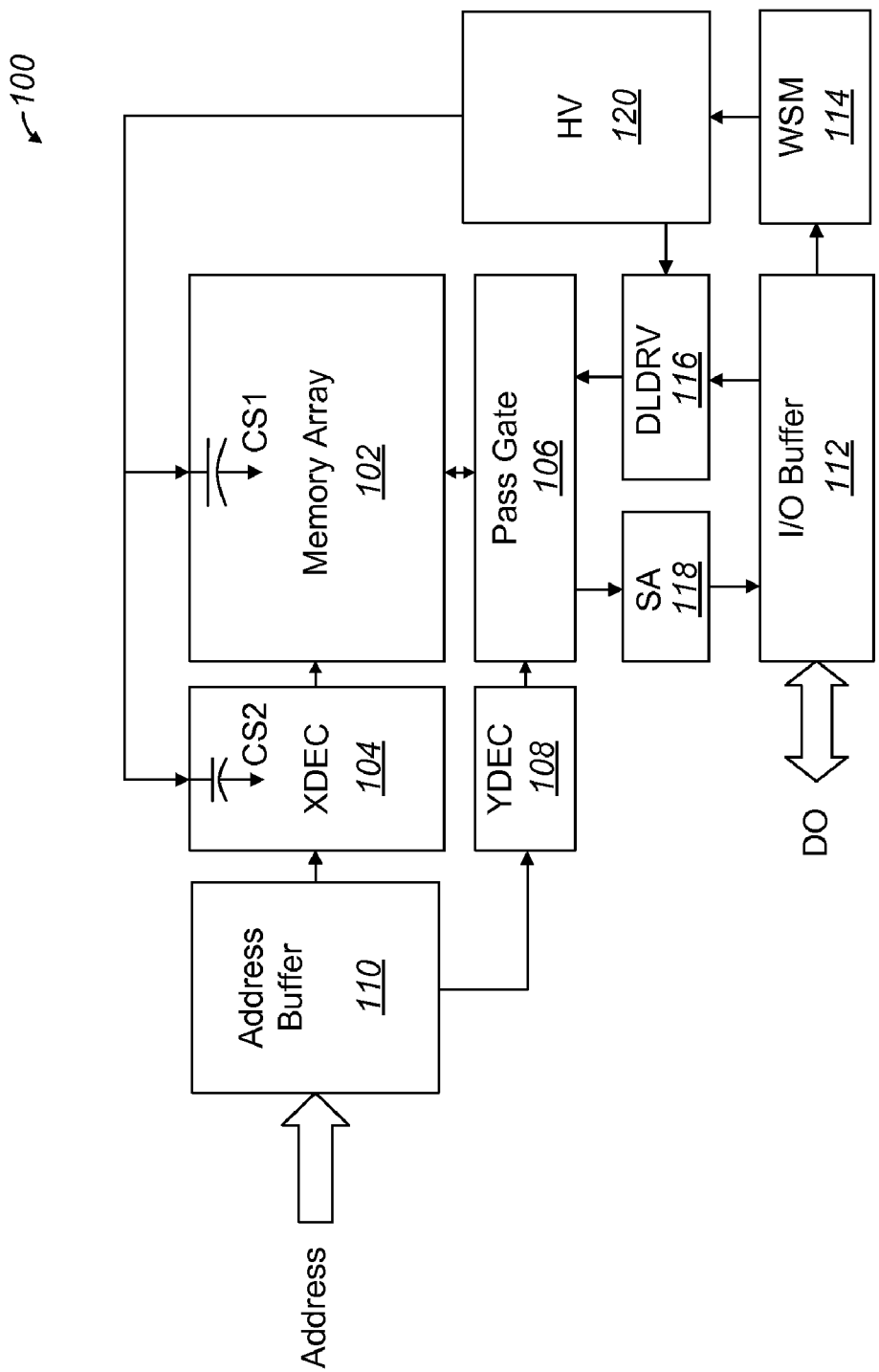
FIG. 1 shows a schematic block diagram of an integrated circuit comprising a non-volatile flash memory device.

FIG. 1 shows a schematic block diagram of an integrated circuit comprising a non-volatile flash memory device 100. Alternative embodiments can include other types of non-volatile memory devices, for example electrically programmable read only memory (EPROM) and electrically erasable and programmable read only memory (EEPROM). The flash memory device 100 includes a memory array 102, which includes a plurality of memory cells arranged in rows and columns for data storage. Each memory cell may store one or more bits of data, which is determined by the logic value of an electrical signal read out from the memory cell.

A row decoder (XDEC) 104 and a pass gate 106 are coupled with the memory array 102 for writing to and reading from the memory cells of the memory array 102. The pass gate 106 includes y-pass transistors that are controlled by a column decoder (YDEC) 108. The row decoder 104 and the column decoder 108 receive memory array addresses from an address buffer 110. The address buffer 110 can be configured for receiving memory array addresses from elsewhere in the integrated circuit and/or from outside the chip. The row decoder 104 and column decoder 108 are configured to select memory cells in the memory array 102 according to the received memory array addresses.

The memory device 100 also includes an I/O buffer 112. The I/O buffer 112 receives data being written to the memory array 102, and outputs data being read from the memory array 102. During programming or erasing, the I/O buffer 112 can also receive various control signals for controlling a write state machine (WSM) 114 and the I/O buffer 112. The I/O buffer 112 also stores input data and makes use of a data-line driver 116 to drive high voltage onto the bit-lines of the memory array 102 based on the input data. The I/O buffer can also includes a sense amplifier 118 for verification of written data and for read operations.

The memory device 100 further includes a high-voltage generator (HV) 120 for generating high voltages, such as those exceeding the chip supply voltage VDD. These high voltages can be used to drive the word lines, bit lines, and ground terminals of the memory array 102 with programming potentials for hot-electron injection and/or Fowler-Nordheim tunneling. The high-voltage generator 120 can also provide a stabilizing word line (WL) voltage during intervals of low read activity so that a certain voltage can be maintained on the word lines, thereby allowing the memory device 100 to more quickly react to read events. The high-voltage generator 120 typically includes one or more charge pumps. Examples of charge pumps used in flash and other types of non-volatile memories include two-phase charge pumping circuits, such as the two-phase charge pumping circuit 200 shown in FIG. 2, and four-phase charge pumping circuits, such as the four-phase charge pumping circuit 300 shown in FIG. 4.

Figure 2:
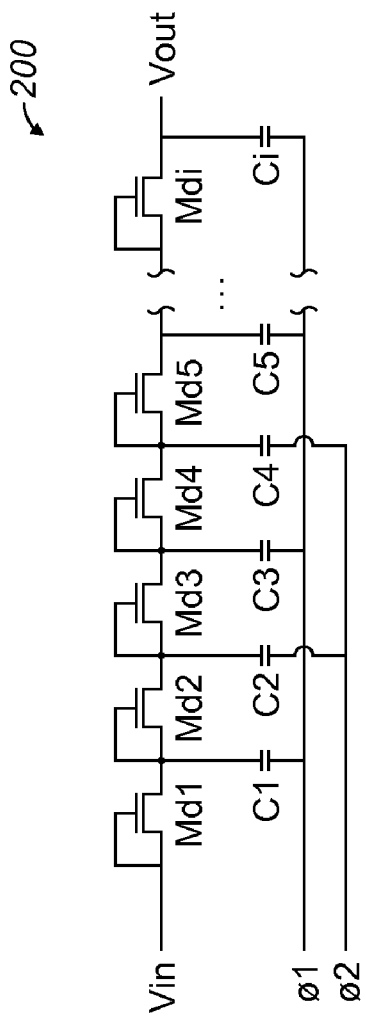
FIG. 2 shows a schematic block diagram of a two-phase charge pumping circuit.

FIG. 2 shows a schematic block diagram of a two-phase charge pumping circuit 200. The charge pumping circuit 200 includes a plurality of cascaded voltage gain circuit stages. Each voltage gain circuit stages has a diode-connected transistor (Md1, Md2, . . . , Mdi) with a drain, a source connected electrically to the drain of the diode-connected transistor (Md2, . . . , Mdi) of an immediately succeeding one of the voltage gain circuit stages, and a gate connected electrically to the drain of the diode-connected transistor (Md1, Md2, . . . , Mdi) thereof. The drain of the diode-connected transistor (Md1) of a first one of the voltage gain circuit stages serves as an input terminal of the charge pumping circuit 200 and is connected electrically to a power source (Vin). The source of the diode-connected transistor (Mdi) of a last one of the voltage gain circuit stages serves as an output terminal (Vout) the charge pumping circuit 200. Each voltage gain circuit stage further includes a capacitor (C1, C2, . . . , Ci). The capacitor (C1, C3, . . . ) of odd ones of the voltage gain circuit stages is connected electrically across a first clock (ø1) and the source of the diode-connected transistor (Md1, Md3, . . . ) of the respective voltage gain circuit stage. The capacitor (C2, C4, . . . ) of even ones of the-voltage gain circuit stages is connected electrically across a second clock (ø2) and the source of the diode-connected transistor (Md2, Md4, . . . ) of the respective voltage gain circuit stage. The first and second clocks (ø1 and ø2) are out of phase. The capacitor (Ci) of the last one of the voltage gain circuit stages is connected electrically to the first clock (ø1) when the total number of the voltage gain circuit stages is an odd number, and is connected electrically to the second clock (ø2) when the total number of the voltage gain circuit stages is an even number. The amplitude of each of the clocks (ø1, ø2) is equal to the voltage of the power source (Vin).

Figure 3:
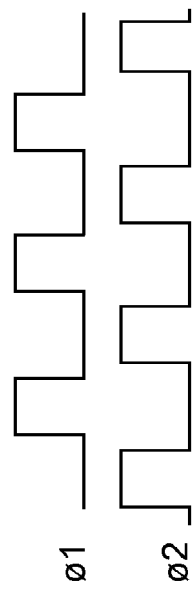
FIG. 3 shows a pulse diagram illustrating the clock signals ø1 and ø2 used in two-phase charge pumping circuits.

FIG. 3 shows a pulse diagram illustrating the clock signals ø1 and ø2 used in the charge pumping circuit 200. When the charge pumping circuit 200 is activated, the capacitor (C1) is charged by the power source (Vin) via the diode-connected transistor (Md1). When the first clock (ø1) is high and the second clock (ø2) is low, the odd ones of the voltage gain circuit stages output a higher voltage due to coupling by the capacitor (C1, C3, . . . ) of the odd ones of the voltage gain circuit stages, thereby charging the capacitor (C2, C4, . . . ) of the immediately succeeding one of the voltage gain circuit stages. When the first clock (ø1) is low and the second clock (ø2) is high, the even ones of the voltage gain circuit stages output a higher voltage due to coupling by the capacitor (C2, C4, . . . ) of the even ones of the voltage gain circuit stages, thereby charging the capacitor (C1, C3, . . . ) of the immediately succeeding one of the voltage gain circuit stages.

Figure 4:
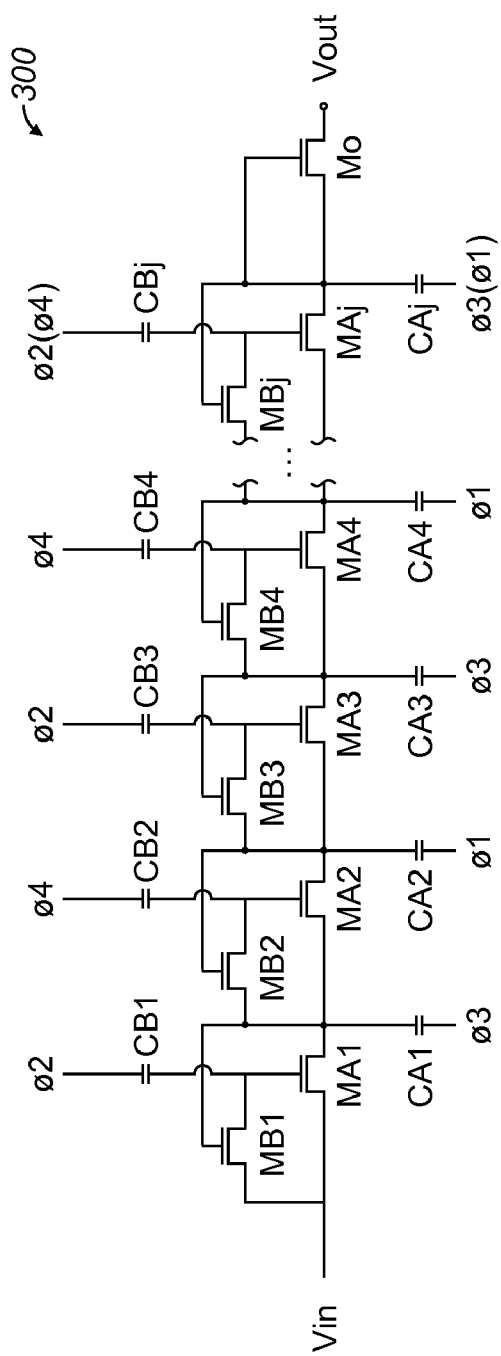
FIG. 4 shows a schematic block diagram of a four-phase charge pumping circuit.

FIG. 4 shows a schematic block diagram of a four-phase charge pumping circuit 300. The four-phase charge pumping circuit 300 includes a plurality of cascaded voltage gain circuit stages. Each voltage gain circuit stage has a first transistor (MA1, MA2, . . . , MAj) and a second transistor (MB1, MB2, . . . , MBj). The first transistor (MA1, MA2, . . . , MAj) of each of the voltage gain circuit stages has a drain, a source connected electrically to the drain of the first transistor (MA2, MA3, . . . , MAj) of an immediately succeeding one of the voltage gain circuit stages, and a gate. The second transistor (MB1, MB2, . . . , MBj) of each of the voltage gain circuit stages has a drain connected electrically to the drain of the first transistor (MA1, MA2, . . . , MAj) of the same voltage gain circuit stage, a source connected electrically to the gate of the first transistor (MA1, MA2, . . . , MAj) of the same voltage gain circuit stage, and a gate connected electrically to the source of the first transistor (MA1, MA2, . . . , MAj) of the same voltage gain circuit stage and to the drain of the second transistor (MB2, MB3, . . . , MBj) of an immediately succeeding one of the voltage gain circuit stages. The drain of the first transistor (MA1) of a first one of the voltage gain circuit stages serves as an input terminal of the four-phase charge pumping circuit 300 and is connected to a power source (Vin). Each voltage gain circuit stage further has a first capacitor (CA1, CA2, . . . , CAj) and a second capacitor (CB1, CB2, . . . , CBj). The first capacitor (CA2, CA4, . . . ) of even ones of the voltage gain circuit stages is connected electrically across a first clock (ø1) and the source of the first transistor (MA2, MA4, . . . ) of the same voltage gain circuit stage. The second capacitor (CB2, CB4, . . . ) of even ones of the voltage gain circuit stages is connected electrically across a fourth clock (ø4), which is out of phase with the first clock (ø1), and the source of the second transistor (MB2, MB4, . . . ) of the same voltage gain circuit stage. The first capacitor (CA1, CA3, . . . ) of odd ones of the voltage gain circuit stages is connected electrically across a third clock (ø3), which is out of phase with the first clock (ø1), and the source of the first transistor (MA1, MA3, . . . ) of the same voltage gain circuit stage. The second capacitor (CB1, CB3, . . . ) of odd ones of the voltage gain circuit stages is connected electrically across a second clock (ø2), which is in phase with the first clock (ø1), and the source of the second transistor (MB1, MB3, . . . ) of the same voltage gain circuit stage.

Figure 5:
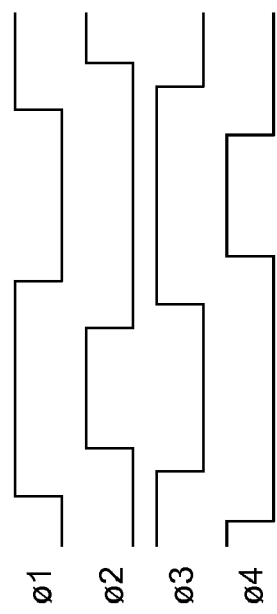
FIG. 5 shows a pulse diagram illustrating the clock signals ø1, ø2, ø3, and ø4 used in four-phase charge pumping circuits.

FIG. 5 shows a pulse diagram illustrating the clock signals ø1, ø2, ø3, and ø4 used in the charge pumping circuit 300. Since all of the transistors (MA1, MA2, . . . , MAj, and MB1, MB2, . . . , MBj) of the voltage gain circuit stages act as switches, the pulse widths of the clocks (ø1, ø2, ø3, ø4) can be different from each other in order to compensate for switching action so as to ensure proper operation of the charge pumping circuit.

The four-phase charge pumping circuit 300 further includes an output circuit stage which has an output transistor (Mo) with a drain connected electrically to the source of the first transistor (MAj) of a last one of the voltage gain circuit stages, a gate connected electrically to the gate of the second transistor (MBj) of the last one of the voltage gain circuit stages, and a source serving as an output terminal (Vout) of the four-phase charge pumping circuit 300.

In operation, when the first and third clocks (ø1 and ø3) are high, and when the second and fourth clocks (ø2 and ø4) are low, the second transistors (MB1, MB2, . . . ) of all of the voltage gain circuit stages are turned on and thus, the high state voltage output from an immediately previous ones of the voltage gain circuit stages charges the second capacitor (CB1, CB2, . . . ). When the first clock (ø1) is high, and when the second, third and fourth clocks (ø2, ø3, and ø4) are low, the second transistor (MB1, MB3, . . . ) of odd ones of the voltage gain circuit stages is turned off and, thus, the high state voltage stored previously in the second capacitor (CB1, CB3, . . . ) of odd ones of the voltage gain circuit stages is maintained. When the first and second clocks (ø1 and ø2) are high, and when the third and fourth clocks (ø3 and ø4) are low, the voltage stored previously in the second capacitor (CB1, CB3, . . . ) of odd ones of the voltage gain circuit stages is coupled to a higher voltage so as to enable the first transistor (MA1, MA3, . . . ) of odd ones of the voltage gain circuit stages to be turned on and to enable the same voltage gain circuit stage to output a high voltage, which is generated by coupling of the voltage provided by the first clock (ø1) with the voltage stored previously in the first capacitor (CA2, CA4, ...) of even ones of the voltage gain circuit stages. When the first clock (ø1) is high, and when the second clock (ø2) becomes low, and when the third and fourth clocks (ø3 and ø4) are low, the first transistor (MA1, MA3, ...) of odd ones of the voltage gain circuit stages is turned off. When the first clock (ø1) is high, when the third clock (ø3) becomes high, and when the second and fourth clocks (ø2 and ø4) are low, the second capacitor (CB1, CB2, ...) of all of the voltage gain circuit stages are turned on again. When the first clock (ø1) becomes low, when the third clock (ø3) is high, and when the second and fourth clocks (ø2 and ø4) are low, the second transistor (MB2, MB4, ...) of even ones of the voltage gain circuit stages are turned off and the high state voltage of the second capacitor (CB2, CB4, ...) of the same is maintained. When the fourth clock (ø4) becomes high, when the third clock (ø3) is high, and when the first and second clocks (ø1 and ø2) are low, voltage stored previously in the second capacitor (CB2, CB4, ...) of even ones of the voltage gain circuit stages is coupled to a higher voltage so as to enable the first transistor (MA2, MA4, ...) of even ones of the voltage gain circuit stages to be turned on and to enable the same voltage gain circuit stage to output a high voltage which is generated by coupling of the voltage provided by the third clock (ø3) with the voltage stored previously in the first capacitor (CA1, CA3, ...) of odd ones of the voltage gain circuit stages. When the fourth clock (ø4) becomes low, when the third clock (ø3) is high, and when the first and second clocks (ø1 and ø2) are low, the first transistor (MA2, MA4, ...) of even ones of the voltage gain circuit stages is turned off.

Some embodiments of the flash memory device 100 can include a high-voltage generator 120 that comprises multiple charge pump circuits. For example, one charge pump circuit, referred to as a drain pump circuit, can include large drain pumping capacitors and can be configured for providing high voltages that are used for write operations, such as the high voltages used for hot-electron injection. A second charge pump circuit, referred to as a standby pump circuit, can be configured for providing a WL voltage for read operations. It is desirable to maintain a stable WL voltage in order to allow for the memory device to quickly react to read commands. For this reason, a sustained capacitance is desirable for maintaining the WL read voltage. The sustained capacitance can be provided from elements of the memory array 102, such as the array well and de-selected gate capacitances. This sustaining capacitance is represented in FIG. 1 by capacitor CS1. In some embodiments, if the density of the chip is small, additional sustained capacitance can be added to the peripheral area of the memory array 102, for example in the row decoder 104 as represented in FIG. 1 by capacitor CS2.

However, the peripheral area of a memory chip can often be larger than the area of the memory chip consumed by the memory array, particularly in embodiments where the density of the chip is low. Thus, when considering options for reducing the overall size of a memory chip, it can be desirable to reduce the size of the peripheral area. Accordingly, some embodiments of the memory device 100 can include a high-voltage generator 120 where the large drain capacitors of the drain pumping circuit are also used as at least a portion of the sustained capacitance for read operations. This configuration advantageously allows for embodiments wherein relatively fewer or no additional sustained capacitance is added to the peripheral area of the memory chip. Embodiments for this configuration are shown in FIGS. 6-9 and are described in greater detail below.

Figure 6:
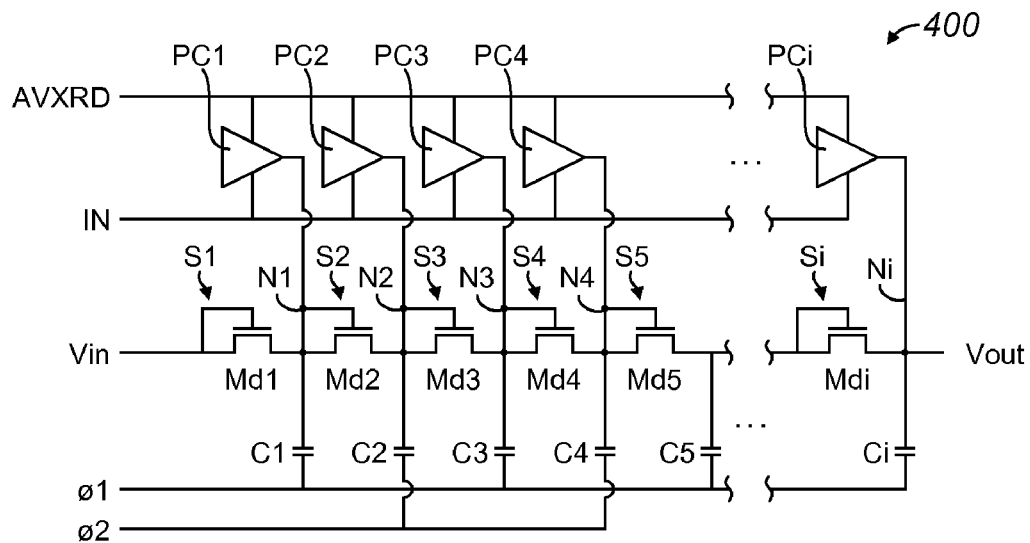
FIG. 6 shows a schematic block diagram of a two-phase charge pumping circuit that includes a series of precharge circuits.

FIG. 6 shows a schematic block diagram of a two-phase charge pumping circuit 400. The charge pumping circuit 400 includes a plurality of cascaded voltage gain circuit stages S1-Si, including a first stage S1, a series of intermediate stages S2-S(i−1), and a last stage Si, where "i" represents the total number of stages. Each of the voltage gain circuit stages S1-Si has a respective diode-connected transistor (Md1, Md2, ..., Mdi) with a drain, a source connected electrically to a respective output node (N1, N2, ..., Ni), and a gate connected electrically to the drain of the diode-connected transistor (Md1, Md2, ..., Mdi) thereof. For all but the last of the voltage gain circuit stages S1-S(i−1), the source of the diode-connected transistor (Md1, Md2, ..., Md(i−1)) is also connected to an immediately succeeding one of the voltage gain circuit stages (S2, S3, ..., Si). The gate and drain of the diode-connected transistor (Md1) of the first voltage gain circuit stage S1 serves as an input terminal of the charge pumping circuit 400 and is connected electrically to a power source (Vin). The respective gates and drains of the diode-connected transistors (Md2, Md3, ..., Mdi) of the remaining voltage gain circuit stages (S2, S3, ..., Si) are connected to respective output nodes (N1, N2, ..., N(i−1)) of the immediately preceding voltage gain circuit stage (S1, S2, ..., S(i−1)). The source of the diode-connected transistor (Mdi) of the last voltage gain circuit stage Si is connected to the last output node Ni, which serves as an output terminal (Vout) the charge pumping circuit 400.

Each of the voltage gain circuit stages S1-Si further includes a respective capacitor (C1, C2, ..., Ci). The capacitor (C1, C3, ...) of odd ones of the voltage gain circuit stages (S1, S3, ...) is connected electrically between a first clock signal (ø1) and the output node (N1, N3, ...) of the respective voltage gain circuit stage (S1, S3, ...). The capacitor (C2, C4, ...) of even ones of the voltage gain circuit stages (S2, S4, ...) is connected electrically between a second clock (ø2) and the output node (N2, N4, ...) of the respective voltage gain circuit stage (S2, S4, ...). The first and second clocks (ø1 and ø2) can be out of phase, for example as shown in FIG. 3. The capacitor (Ci) of the last one of the voltage gain circuit stages Si is connected electrically to the first clock (ø1) when the total number i of the voltage gain circuit stages is an odd number, and is connected electrically to the second clock (ø2) when the total number i of the voltage gain circuit stages is an even number. The amplitude of each of the clocks (ø1, ø2) can be equal to the voltage of the power source (Vin).

A plurality of precharge circuits PC1-PCi are coupled to respective output nodes N1-Ni of the voltage gain circuit stages S1-Si. More specifically, each of the precharge circuits PC1-PCi is configured to output a respective voltage to a respective one of the output nodes N1-Ni. The output voltages of the precharge circuits PC1-PCi are controlled according to a control signal IN and a WL standby voltage AVXRD. In some embodiments, for example, AVXRD can be a standby WL voltage level of about 5 volts, and the control signal IN can vary between 0 volts and AVXRD.

The plurality of precharge circuits PC1-PCi comprise circuitry having a first state preventing the output node Vout from falling significantly below the voltage level of AVXRD, and allowing the output node Vout to fluctuate at a level above VDD in response to the pumping clocks/capacitors, and thereby performing a precharge and clamping function, and a second state coupling the output node Vout to a source of the standby WL voltage level AVXRD. Thus, the precharge circuits PC1-PCi provide circuitry for configuring the plurality of stages S1-Si for operation in a first mode in which the plurality of stages S1-Si act in the first state as charging pump circuitry. The precharge circuits PC1-PCi also provide circuitry for configuring the plurality of stages S1-Si for operation in a second mode in which the output node N of each stage S is coupled to a source of the standby WL voltage AVXRD through a respective precharge circuit PC.

When the charge pumping circuit 400 is activated and the precharge circuits PC1-PCi are operating in the first mode, the capacitor (C1) is charged by the power source (Vin) via the diode-connected transistor (Md1). When the first clock (ø1) is high and the second clock (ø2) is low, the odd ones of the voltage gain circuit stages output a higher voltage due to coupling by the capacitor (C1, C3, ...) of the odd ones of the voltage gain circuit stages, thereby charging the capacitor (C2, C4, ...) of the immediately succeeding one of the voltage gain circuit stages. When the first clock (ø1) is low and the second clock (ø2) is high, the even ones of the voltage gain circuit stages output a higher voltage due to coupling by the capacitor (C2, C4, ...) of the even ones of the voltage gain circuit stages, thereby charging the capacitor (C1, C3, ...) of the immediately succeeding one of the voltage gain circuit stages.

When the charge pumping circuit 400 is activated and the precharge circuits (PC1-PCi) are operating in the second mode, the capacitors (C1-Ci) are charged by respective precharge circuits (PC1-PCi) via the respective output node (N1-Ni). In this mode of operation, the capacitors (C1-Ci) provide sustained capacitance for the WL read voltage.

Figure 7:
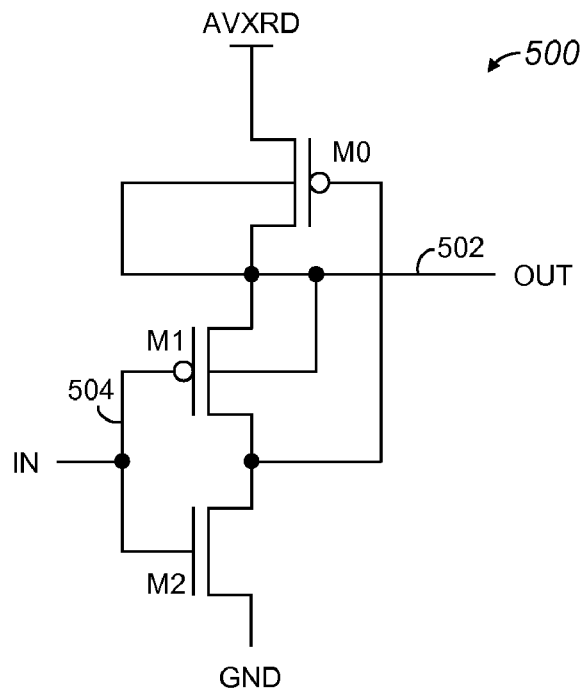
FIG. 7 shows a schematic block diagram of a precharge circuit suitable for use with charge pumping circuits shown in FIGS. 6 and 8.

FIG. 7 shows a schematic block diagram of a precharge circuit 500 suitable for use as the precharge circuits PC1-PCi in the charge pumping circuit 400 shown in FIG. 6. The precharge circuit 500 includes a first PMOS transistor M0, a second PMOS transistor M1, and an NMOS transistor M2. The source of the first PMOS transistor M0 is coupled to a source of the standby WL voltage level AVXRD. The drain and n-well of the first PMOS transistor M0 are coupled to node 502, which is coupled to the output node N of the corresponding stage in the charge pumping circuit 400. The source and n-well of the second PMOS transistor M1 are coupled to the drain of the first PMOS transistor M0 and to node 502. The drain of the second PMOS transistor M1 is coupled to the gate of the first PMOS transistor M0. The drain of the NMOS transistor M2 is coupled to the drain of the second PMOS transistor M1 and to the gate of the first PMOS transistor M0. The source of the NMOS transistor M2 is coupled to a reference supply (e.g., ground). The gates of the second PMOS transistor M1 and the NMOS transistor M2 are coupled together to an input node 504, which receives the control signal IN for the precharge circuit 500.

In operation, when the control signal IN on node 504 is high, the gate of the first PMOS transistor M0 is low, thereby turning on the transistor M0, and also thereby coupling the source of the standby WL voltage level AVXRD to the output node 502, without a threshold drop or other significant voltage loss. In this manner, the standby WL voltage level AVXRD is applied to the output node N of the corresponding stage of the charge pumping circuit 400. When the control signal IN on node 504 is low, the second PMOS transistor M1 is on, thereby coupling the output voltage OUT on the output node 502 to the gate of the first PMOS transistor M0. In this state, the precharge circuit 500 acts as a precharge clamp, turning on first PMOS transistor M0 when the output node 502 falls below the standby WL voltage level AVXRD. However, during operation, the output node N of the charge pumping circuit 300 that is coupled to the output node 502 on the precharge circuit 500 will be higher than AVXRD, so that the PMOS transistor M0 does not turn on, and does not affect operation of the charge pumping circuit 500.

Typically, the control signal IN will be high during a read operation. When IN is at a high level, all of the output nodes N1-Ni of the charge pumping circuit 400 will be pre-charged to the standby WL voltage level AVXRD. At this time, the clock signals (ø1, ø2) will be at ground level (low). Therefore, the capacitors C1-Ci are pre-charged to the standby WL voltage level AVXRD. The control signal IN will be low for an embedded operation (e.g., program and erase operations). When the control signal IN is at a low level, all of the output nodes N1-Ni are free running according to the operation of the charge pumping circuit 400 according to the inputted clock signals (ø1, ø2). For the initiation of an embedded operation, the control signal IN transitions from high to low, and at this transition time the capacitors C1-Ci are precharged to the standby WL voltage level AVXRD, which will typically exceed the chip supply voltage VDD. Since the capacitors C1-Ci are already pre-charged to AVXRD, the setup time is faster for charging the capacitors C1-Ci to higher levels for embedded operations, such as a voltage used for hot-electron injection. When the operation is switched from an embedded operation to a read operation, the control signal IN transitions from low to high. For the transition from an embedded operation to a read operation, a recover interval can be reserved for allowing the output nodes N1-Ni to recover back down from the higher voltage used for the embedded operation to the standby WL voltage level AVXRD.

Figure 8:
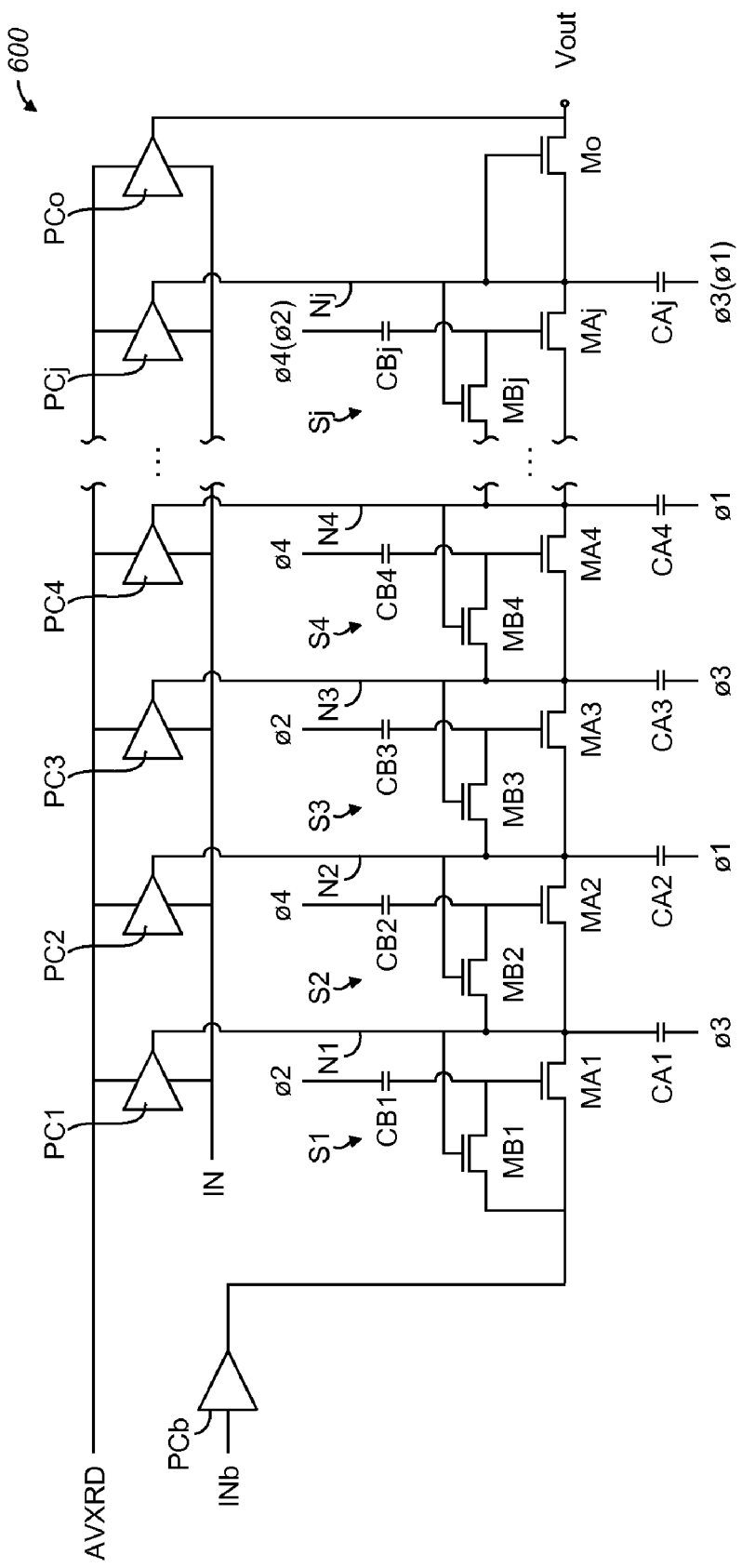
FIG. 8 shows a schematic block diagram of a four-phase charge pumping circuit that includes a series of precharge circuits.

FIG. 8 shows a schematic block diagram of a four-phase charge pumping circuit 600. The four-phase charge pumping circuit 600 includes a plurality of cascaded voltage gain circuit stages SA1-SAj, including a first stage SA1, a series of intermediate stages SA2-SA(j−1), and a last stage Sj, where "j" represents the total number of stages. Each of the voltage gain circuit stages SA1-SAj has a first transistor (MA1, MA2, ..., MAj) and a second transistor (MB1, MB2, ..., MBj). The first transistor (MA1, MA2, ..., MAj) of each of the voltage gain circuit stages has a drain, a source connected electrically to a respective output node (NA1, NA2, ..., NAj), and a gate. For all but the last of the voltage gain circuit stages SA1-SA(j−1), the source of the first transistor (MA1, MA2, ..., MA(j−1)) is also connected to an immediately succeeding one of the voltage gain circuit stages (SA2, SA3, ..., SAj), specifically to the drain of the first transistor (MA2, MA3, ..., MAj) of an immediately succeeding one of the voltage gain circuit stages (SA2, SA3, ..., SAj). The second transistor (MB1, MB2, ..., MBj) of each of the voltage gain circuit stages (SA1, SA2, ..., SAj) has a drain connected electrically to the drain of the first transistor (MA1, MA2, ..., MAj) of the same voltage gain circuit stage SA, a source connected electrically to the gate of the first transistor (MA1, MA2, ..., MAj) of the same voltage gain circuit stage SA, and a gate connected electrically to the source of the first transistor (MA1, MA2, ..., MAj) of the same voltage gain circuit stage and to a respective output node (NA1, NA2, ..., NAj). The drain of the first transistor (MA1) of the first voltage gain circuit stage SA1 serves as an input terminal of the four-phase charge pumping circuit 600 and is connected to an output of a precharge circuit PCb.

Each voltage gain circuit stage further has a first capacitor (CA1, CA2, ..., CAj) and a second capacitor (CB1, CB2, ..., CBj). The first capacitor (CA2, CA4, ...) of even ones of the voltage gain circuit stages (SA2, SA4, ...) is connected electrically between a first clock signal (ø1) and the output node (NA2, NA4, ...) of the same voltage gain circuit stage SA. The second capacitor (CB2, CB4, ...) of even ones of the voltage gain circuit stages (SA2, SA4, ...) is connected electrically between a fourth clock signal (ø4), which is out of phase with the first clock signal (ø1), and the source of the second transistor (MB2, MB4, ...) of the same voltage gain circuit stage SA. The first capacitor (CA1, CA3, ...) of odd ones of the voltage gain circuit stages (SA1, SA3, ...) is connected electrically between a third clock signal (ø3), which is out of phase with the first clock signal (ø1), and the output node (NA1, NA3, ...) of the same voltage gain circuit stage SA. The second capacitor (CB1, CB3, ...) of odd ones of the voltage gain circuit stages (SA1, SA3, ...) is connected electrically between a second clock (ø2), which is in phase with the first clock (ø1), and the source of the second transistor (MB1, MB3, ...) of the same voltage gain circuit stage SA.

FIG. 5 shows a pulse diagram illustrating the clock signals ø1, ø2, ø3, and ø4 that can be used in the charge pumping circuit 600. Since all of the transistors (MA1, MA2, ..., MAj, and MB1, MB2, ..., MBj) of the voltage gain circuit stages act as switches, the pulse widths of the clock signals (ø1, ø2, ø3, ø4) can be different from each other in order to compensate for switching action so as to ensure proper operation of the charge pumping circuit 600.

The four-phase charge pumping circuit 600 further includes an output circuit stage which has an output transistor (Mo) with a drain and a gate that are both connected electrically to the output node Naj of the last voltage gain circuit stage SAj, and a source serving as an output terminal (Vout) of the four-phase charge pumping circuit 600.

A plurality of precharge circuits PC1-PCj are coupled to respective output nodes NA1-NAj of the voltage gain circuit stages SA1-SAj. More specifically, each of the precharge circuits PC1-PCj is configured to output a respective voltage to a respective one of the output nodes NA1-NAi. An additional precharge circuit PCo is coupled to the output terminal Vout. The output voltages of the precharge circuits PC1-PCj and PCo are controlled according to a control signal IN and a WL standby voltage AVXRD in the same manner as described above in connection with FIGS. 6 and 7.

The plurality of precharge circuits PC1-PCj comprise circuitry having a first state preventing the output node Vout from falling significantly below the voltage level of AVXRD, and allowing the output node Vout to fluctuate at a level above VDD in response to the pumping clocks/capacitors, and thereby performing a precharge and clamping function, and a second state coupling the output node Vout to a source of the standby WL voltage level AVXRD. Thus, the precharge circuits PC1-PCj provide circuitry for configuring the plurality of stages SA1-SAj for operation in a first mode in which the plurality of stages SA1-SAj act in the first state as charging pump circuitry. The precharge circuits PC1-PCj also provide circuitry for configuring the plurality of stages SA1-SAj for operation in a second mode in which the output node N of each stage SA is coupled to a source of the standby WL voltage AVXRD through a respective precharge circuit PC. For consistency, it is desirable to include the additional precharge circuit PCo coupled to Vout for reducing the ripple on node Vout for successive high voltage switching operations. Therefore, when operating in the second mode, it is desirable to use the sustained capacitance for better WL voltage regulation.

An additional precharge circuit PCb is coupled to the input terminal of the four-phase charge pumping circuit 600. More specifically, the output node of the precharge circuit PCb is electrically connected to the drains of the first and second transistors MA1 and MB1 of the first voltage gain circuit stage SA1.

Figure 9:
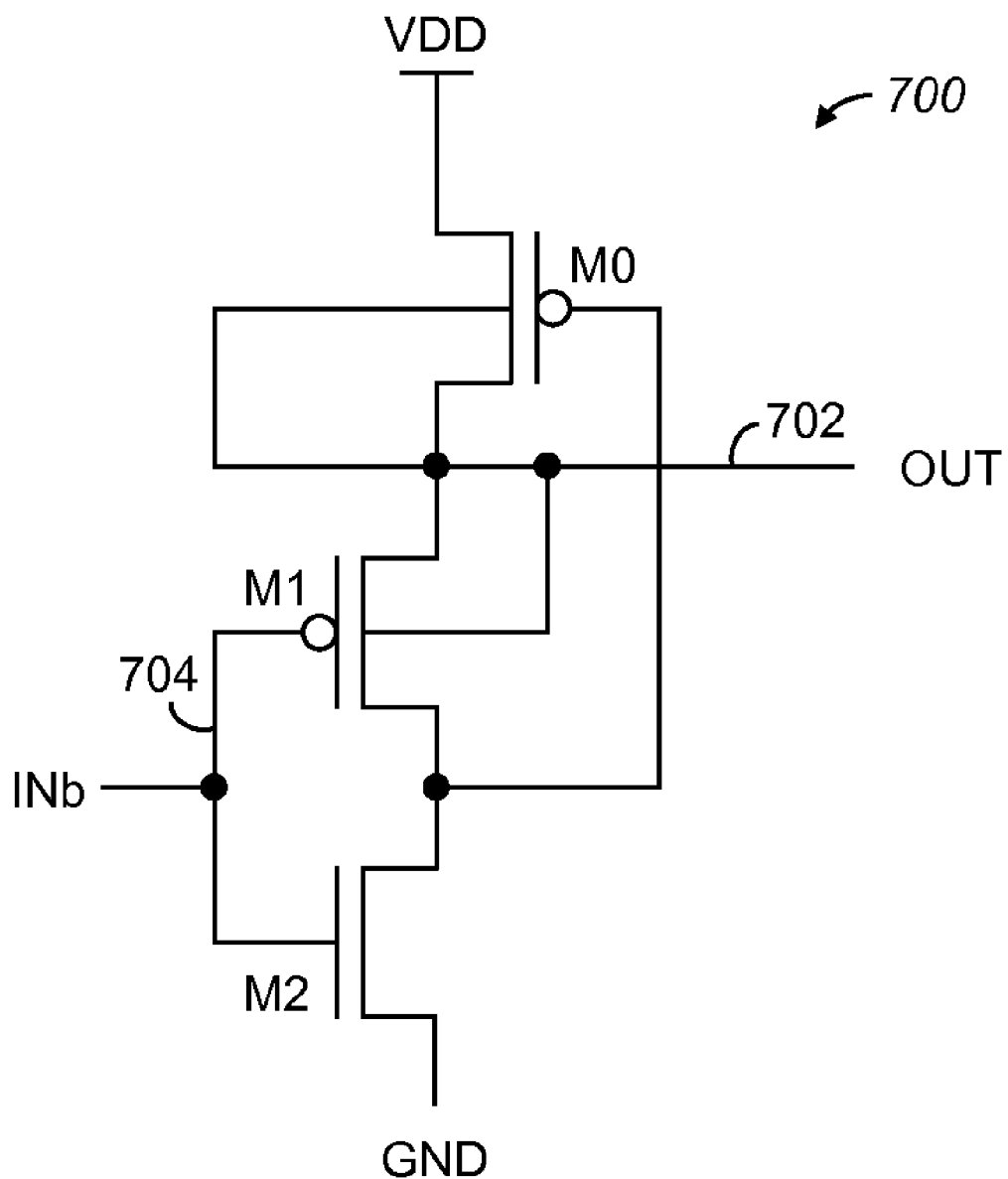
FIG. 9 shows a schematic block diagram of a precharge circuit suitable for providing signals to the input terminal of the charge pumping circuit shown in FIG. 8.

FIG. 9 shows a schematic block diagram of a precharge circuit 700 suitable for use as the precharge circuits PCb in the charge pumping circuit 600 shown in FIG. 8. The precharge circuit 700 includes a first PMOS transistor M0, a second PMOS transistor M1, and an NMOS transistor M2. The precharge circuit 700 can be similar to the precharge circuit 500 shown in FIG. 7, except that in the precharge circuit 700 the source of the first PMOS transistor M0 is coupled to a supply voltage source VDD, and an input node 704 receives a control signal INb, which can be the inverse of the control signal IN. Also, the drain and n-well of the first PMOS transistor M0 are coupled to node 702, which is coupled to the input terminal of the four-phase charge pumping circuit 600. The source and n-well of the second PMOS transistor M1 are coupled to the drain of the first PMOS transistor M0 and to node 702. The drain of the second PMOS transistor M1 is coupled to the gate of the first PMOS transistor M0. The drain of the NMOS transistor M2 is coupled to the drain of the second PMOS transistor M1 and to the gate of the first PMOS transistor M0. The source of the NMOS transistor M2 is coupled to ground. The gates of the second PMOS transistor M1 and the NMOS transistor M2 are coupled together to an input node 504, which receives the control signal INb for the precharge circuit 700.

In operation, when the control signal IN is low, representative of an embedded operation (e.g., program or erase operation), the control signal INb on node 704 is high, so the gate of the first PMOS transistor M0 is low, thereby turning on the transistor M0, and also thereby coupling the source of the supply voltage VDD to the output node 702, without a threshold drop or other significant voltage loss. In this manner, the supply voltage level VDD is applied to the input terminal of the charge pumping circuit 600. When the control signal IN is high, representative of a read operation, the control signal Inb on node 704 is low, so the second PMOS transistor M1 is on, thereby coupling the output voltage OUT on the output node 702 to the gate of the first PMOS transistor M0. In this state, the precharge circuit 700 acts as a precharge clamp, turning on first PMOS transistor M0 when the output node 702 falls below the supply voltage level VDD.

The precharge circuit PCb is an optional precharge circuit, so in some embodiments the precharge circuit PCb can be omitted. In FIG. 6, the node N1 in the second mode is AVXRD higher than Vcc and transistor Md1 is reverse-diode connected. Therefore, there is no current injection from N1 to Vin for the two-phase charge pump. Similarly, if the precharge circuit PCb shown in FIG. 8 is omitted, N1 node will also be precharged to AVXRD higher than Vcc in the second mode, thereby turning transistor MB1 fully on. Therefore, an input voltage Vin will be coupled to the gate of MA1. Therefore, MA1 is reverse-diode connected if N1 is AVXRD.

During a time when the charge pumping circuit 600 is activated and the precharge circuits PC1-PCj are operating in the first mode, the charge pumping circuit 600 operates in a manner similar to the four-phase charge pumping circuit 300. When the charge pumping circuit 600 is activated and the precharge circuits (PC1-PCj) are operating in the second mode, the capacitors (CA1-CAj and CB1-CBj) are charged by respective precharge circuits (PC1-PCj) via the respective output node (NA1-NAj). In this mode of operation, the capacitors (CA1-CAj and CB1-CBj) provide sustained capacitance for the WL read voltage.

Typically, the control signal IN will be high during a read operation, and the control signal Inb will be low. When IN is at a high level, all of the output nodes NA1-NAj of the charge pumping circuit 600 will be pre-charged to the standby WL voltage level AVXRD. At this time, the clock signals (ø1, ø2, ø3, ø4) will be at ground level (low). Therefore, the capacitors (CA1-CAj and CB1-CBj) are pre-charged to the standby WL voltage level AVXRD. The control signal IN will be low for an embedded operation (e.g., program and erase operations).

When the control signal IN is at a low level, the control signal INb will be at a high level, and all of the output nodes NA1-NAi are free running according to the operation of the charge pumping circuit 600 according to the inputted clock signals (ø1, ø2, ø3, ø4). For the initiation of an embedded operation, the control signal IN transitions from high to low, and at this transition time the capacitors (CA1-CAj and CB1-CBj) are pre-charged to the standby WL voltage level AVXRD, which will typically exceed the chip supply voltage VDD. Since the capacitors (CA1-CAj and CB1-CBj) are already pre-charged to AVXRD, the setup time is faster for charging the capacitors (CA1-CAj and CB1-CBj) to higher levels for embedded operations, such as a voltage used for hot-electron injection. When the operation is switched from an embedded operation to a read operation, the control signal IN transitions from low to high. For the transition from an embedded operation to a read operation, a recover interval can be reserved for allowing the output nodes NA1-NAi to recover back down from the higher voltage used for the embedded operation to the standby WL voltage level AVXRD.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for operating a charge pump, comprising:
    operating the charge pump in a first mode, wherein an output voltage at an output terminal of the charge pump is generated by charging pump circuitry to produce a first output voltage signal; and
    operating the charge pump in a second mode, wherein an output voltage at the output terminal of the charge pump is generated by a source of a standby wordline voltage to produce a second output voltage signal.

2. The method of claim 1, wherein the charge pump has a plurality of stages, and wherein the method further comprises:
    receiving clock signals to the charge pump; and
    applying the clock signals to stages of the charge pump to produce the first output voltage signal in the first mode of operation.

3. The method of claim 1, wherein the charge pump has a plurality of stages, and wherein the method further comprises:
    receiving the standby wordline voltage to the charge pump; and
    applying the standby wordline voltage to stages of the charge pump to produce the second output voltage signal in the second mode of operation.

4. An integrated circuit device, comprising:
    a memory array having a first mode for at least one of programming and erasing and a second mode for reading;
    charge pump circuitry coupled to the memory array, operable in the first mode and the second mode, the charge pump circuitry including a plurality of charge pump stages; and
    precharge circuitry for controlling the charge pump circuitry to operate in the first mode or the second mode;
    wherein the plurality of charge pump stages are responsive to a plurality of clock signals while the charge pump is operating in the first mode, and
    wherein the precharge circuitry couples the charge pump stages to a standby wordline voltage while the charge pump is operating in the second mode.

5. The integrated circuit of claim 4, wherein the precharge circuitry comprises a plurality of precharge circuits coupled to respective charge pump stages, at least one precharge circuit in the plurality of precharge circuits having a first state allowing a node on the corresponding charge pump stage to fluctuate at a level above the standby wordline voltage, and a second state coupling the node to the standby wordline voltage.

6. The integrated circuit of claim 5, wherein the at least one precharge circuit comprises:
    a first PMOS transistor having a source terminal coupled to a source of the standby wordline voltage, a drain terminal coupled to said node on the corresponding charge pump stage, and a gate;
    a second PMOS transistor having a source terminal coupled to said node on the corresponding charge pump stage, a drain terminal coupled to the gate of the first PMOS transistor, and a gate coupled to an input node; and
    an NMOS transistor having a source terminal coupled to a reference supply, a drain terminal coupled to the gate of the first PMOS transistor, and a gate coupled to the input node.

7. The integrated circuit of claim 6, wherein the input node receives a control signal representative of whether the memory array is operating in the first mode or the second mode.

8. The integrated circuit of claim 4, wherein the plurality of charge pump stages includes a first charge pump stage coupled to an input terminal of the charge pump circuitry, and wherein the precharge circuitry further comprises a precharge circuit coupled to the input terminal and having a first state allowing the input terminal of the charge pump circuitry to fluctuate at a level above a supply voltage level, and a second state coupling the input terminal of the charge pump circuitry to the supply voltage.

9. The integrated circuit of claim 8, wherein, when the memory array is in the first mode, the precharge circuit is in the first state, and when the memory array is in the second mode, the precharge circuit is in the second state.

10. The integrated circuit of claim 4, wherein at least one of the charge pump stages is configured to receive a single clock signal.

11. The integrated circuit of claim 4, wherein at least one of the charge pump stages is configured to receive first and second clock signals, the first clock signal being out of phase with the second clock signal.

12. A charge pump apparatus, comprising:
   a plurality of stages including a first stage and one or more succeeding stages, at least one of the succeeding stages including an output node coupled to another of the plurality of stages; and
   a charge boosting circuit coupled to the output node of the at least one of the succeeding stages, the charge boosting circuit receiving one or more clock signals; and
   a precharge circuit coupled to the output node of the at least one of the succeeding stages, the precharge circuit having a first state allowing the output node to fluctuate at a level above a standby wordline voltage, and a second state coupling the output node to the standby wordline voltage.

13. The charge pump apparatus of claim 12, wherein the at least one charge pump stage is responsive to the one or more clock signals while the charge pump apparatus is operating in a first mode.

14. The charge pump apparatus of claim 13, wherein the precharge circuit couples the at least one charge pump stage to the standby wordline voltage while the charge pump is operating in a second mode.

15. The charge pump apparatus of claim 14, wherein the precharge circuit receives a control signal for controlling the precharge circuit to operate in a selected one of the first and second states.

16. The charge pump apparatus of claim 14, wherein the charge pump is configured to operate in the first mode when the at least one precharge circuit is in the first state, and charge pump is configured to operate in the second mode when the at least one precharge circuit is in the second state.

17. The charge pump apparatus of claim 12, wherein the pump circuit further comprises an input terminal coupled between the first stage and a supply voltage.

18. The charge pump apparatus of claim 12, wherein the precharge circuit is a first precharge circuit, and wherein the pump circuit further comprises an input terminal coupled between the first stage and a second precharge circuit, the second precharge circuit having a first state allowing the input terminal to fluctuate at a level above a supply voltage level, and a second state coupling the input terminal to the supply voltage.

19. The charge pump apparatus of claim 12, wherein the precharge circuit comprises:
   a first PMOS transistor having a source terminal coupled to a source of the standby wordline voltage, a drain terminal coupled to the output node on the at least one stage, and a gate;
   a second PMOS transistor having a source terminal coupled to the output node on the at least one stage, a drain terminal coupled to the gate of the first PMOS transistor, and a gate coupled to an input node; and
   an NMOS transistor having a source terminal coupled to a reference supply, a drain terminal coupled to the gate of the first PMOS transistor, and a gate coupled to the input node.

20. The charge pump apparatus of claim 12, wherein the at least one stage is configured to receive a single clock signal of the one or more clock signals.

21. The charge pump apparatus of claim 12, wherein the at least one stage is configured to receive first and second clock signals of the one or more clock signals, the first clock signal being out of phase with the second clock signal.

* * * * *